United States Patent [19]

Shimizu et al.

[11] Patent Number: 5,061,654

[45] Date of Patent: Oct. 29, 1991

[54] SEMICONDUCTOR INTEGRATED CIRCUIT HAVING OXIDE REGIONS WITH DIFFERNT THICKNESS

[75] Inventors: Masahiro Shimizu; Katsuhiro Tsukamoto, both of Hyogo, Japan

[73] Assignee: Mitsubishi Denki Kabushiki Kaisha, Tokyo, Japan

[21] Appl. No.: 213,497

[22] Filed: Jun. 30, 1988

[30] Foreign Application Priority Data

Jul. 1, 1987 [JP] Japan ............................ 62-164428
Sep. 8, 1987 [JP] Japan ............................ 62-225023

[51] Int. Cl.$^5$ ........................................... H01L 21/70
[52] U.S. Cl. ................................... 437/70; 437/43; 437/47; 437/48; 437/52; 437/60; 437/69; 437/235; 437/919; 357/23.5; 357/23.6
[58] Field of Search ............ 437/43, 47, 52, 60, 437/69, 70, 2, 40, 41, 48, 51, 191, 193, 195, 233, 235, 919; 357/23.6, 23.5, 45

[56] References Cited

U.S. PATENT DOCUMENTS

| | | | |
|---|---|---|---|
| 3,855,008 | 12/1974 | Huber et al. | 437/41 |
| 4,208,781 | 6/1980 | Rao et al. | 437/70 |
| 4,352,236 | 10/1982 | McCullom | 437/70 |
| 4,384,399 | 5/1983 | Kuo | 437/52 |
| 4,385,432 | 5/1983 | Kuo et al. | 437/52 |
| 4,412,375 | 11/1983 | Matthews | 437/70 |
| 4,536,947 | 8/1985 | Bohr et al. | 357/51 |
| 4,561,170 | 12/1985 | Doering et al. | 437/52 |
| 4,574,465 | 3/1986 | Rao | 357/23.6 |

FOREIGN PATENT DOCUMENTS

| | | |
|---|---|---|
| 0013743 | 2/1981 | Japan . |
| 2080024 | 1/1982 | United Kingdom . |
| 2143675 | 2/1985 | United Kingdom ............ 437/52 |

OTHER PUBLICATIONS

Local Oxidation of Silicon by J. A. Appels et al. Philips Res. Repts 25, 118–132, 1970.
Deep Trench Isolated Cmos Devices by R. D. Rung et al., 1982 p. 237.

Primary Examiner—Brian E. Hearn
Assistant Examiner—Tom Thomas
Attorney, Agent, or Firm—Lowe, Price, LeBlanc and Becker

[57] ABSTRACT

A method of manufacturing a semiconductor memory device having a peripheral circuit portion, the operating voltage of which is relatively high and a memory array portion, the operating voltage of which is relatively low comprises the steps of forming an inversion preventing layer on the peripheral circuit portion, forming an oxide layer for isolation between devices adjacent thereto, forming on the memory array portion the inversion preventing layer, the impurity concentration of which is higher than that of the peripheral circuit portion and forming the oxide layer on the peripheral circuit portion at the same time that the oxide layer for isolation between devices is formed adjacent thereto.

6 Claims, 10 Drawing Sheets

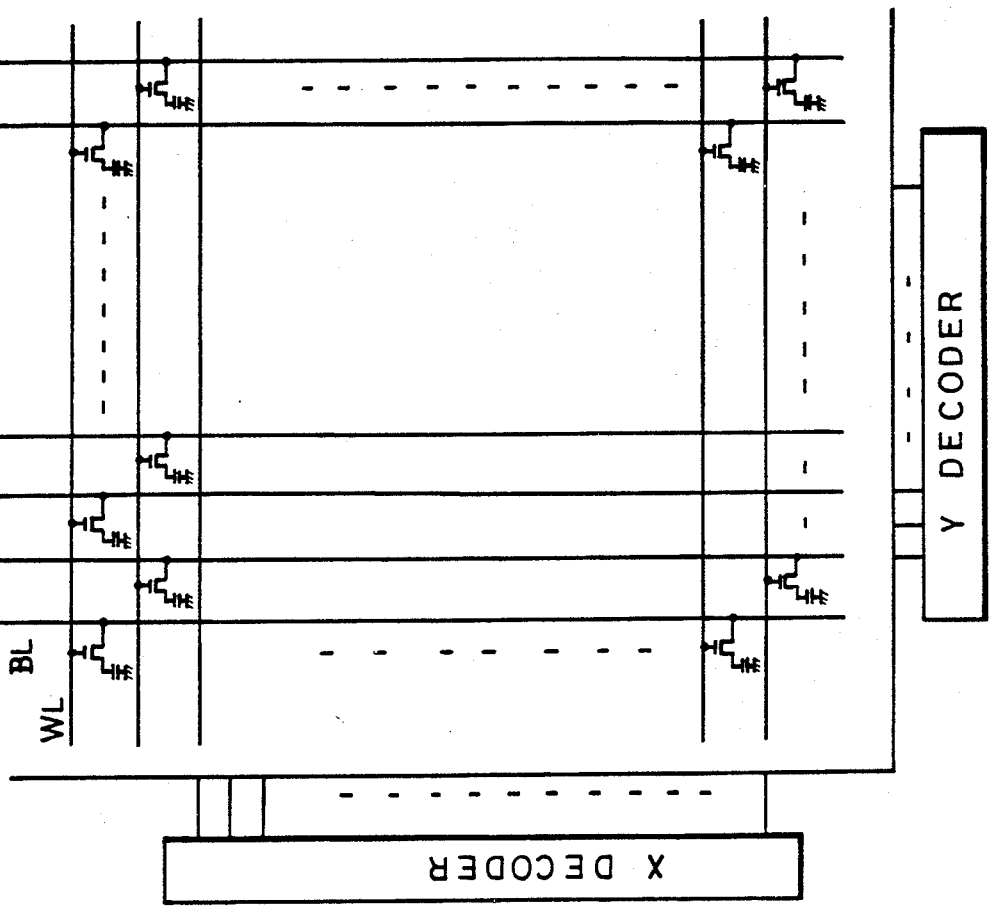
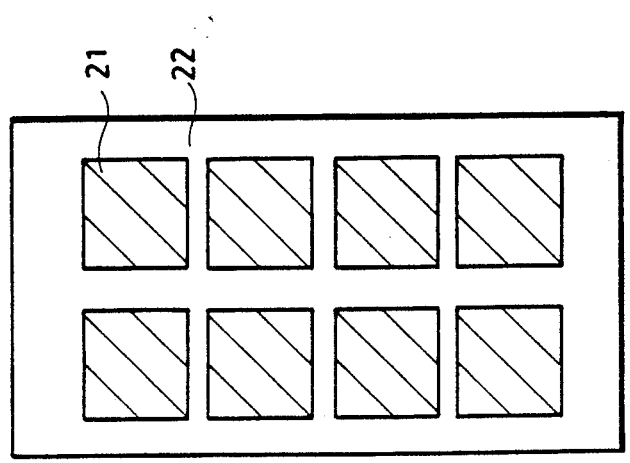

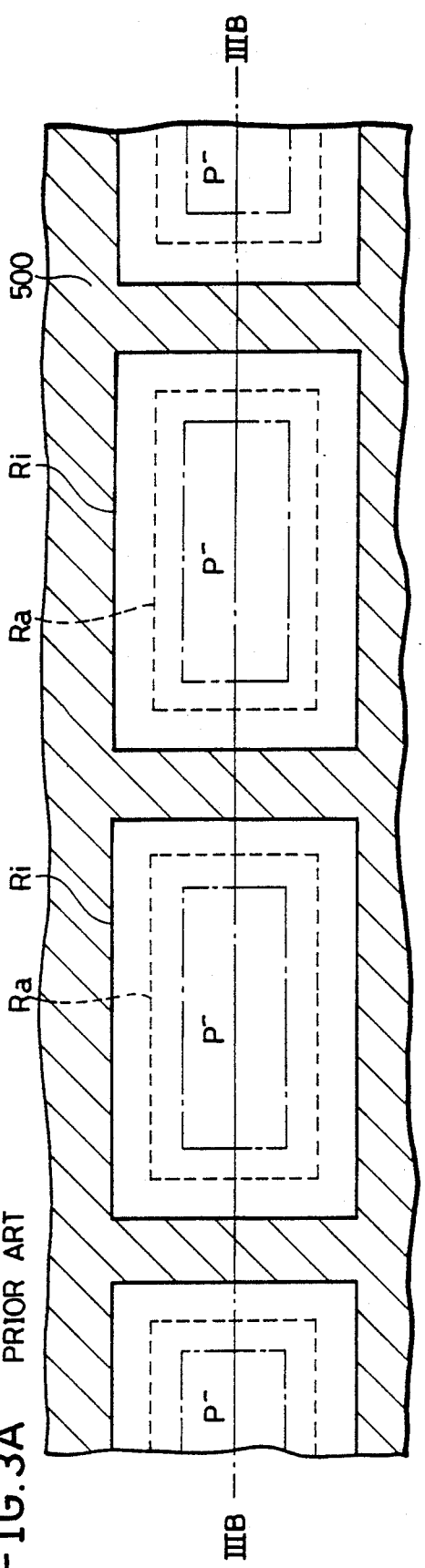
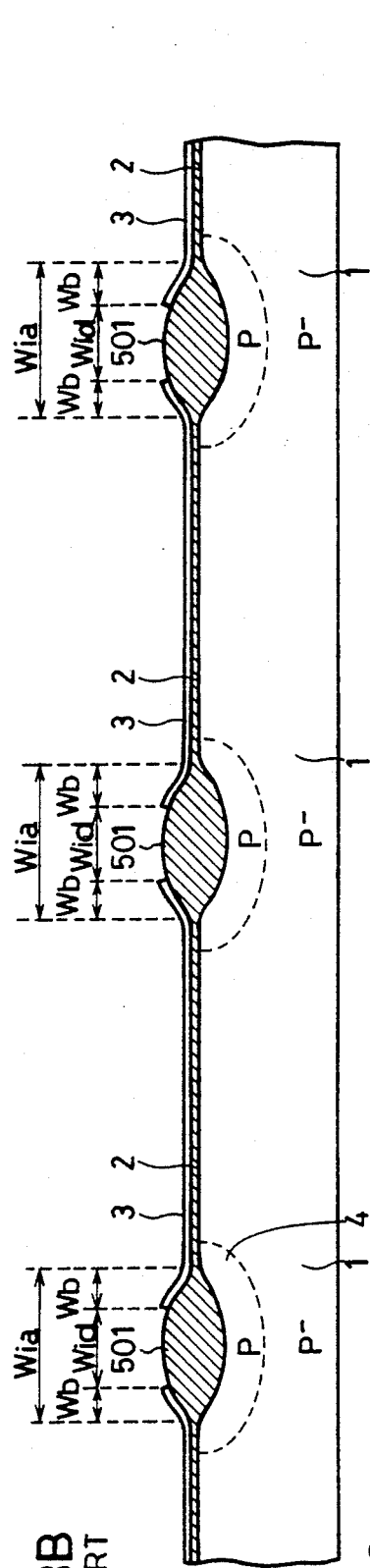
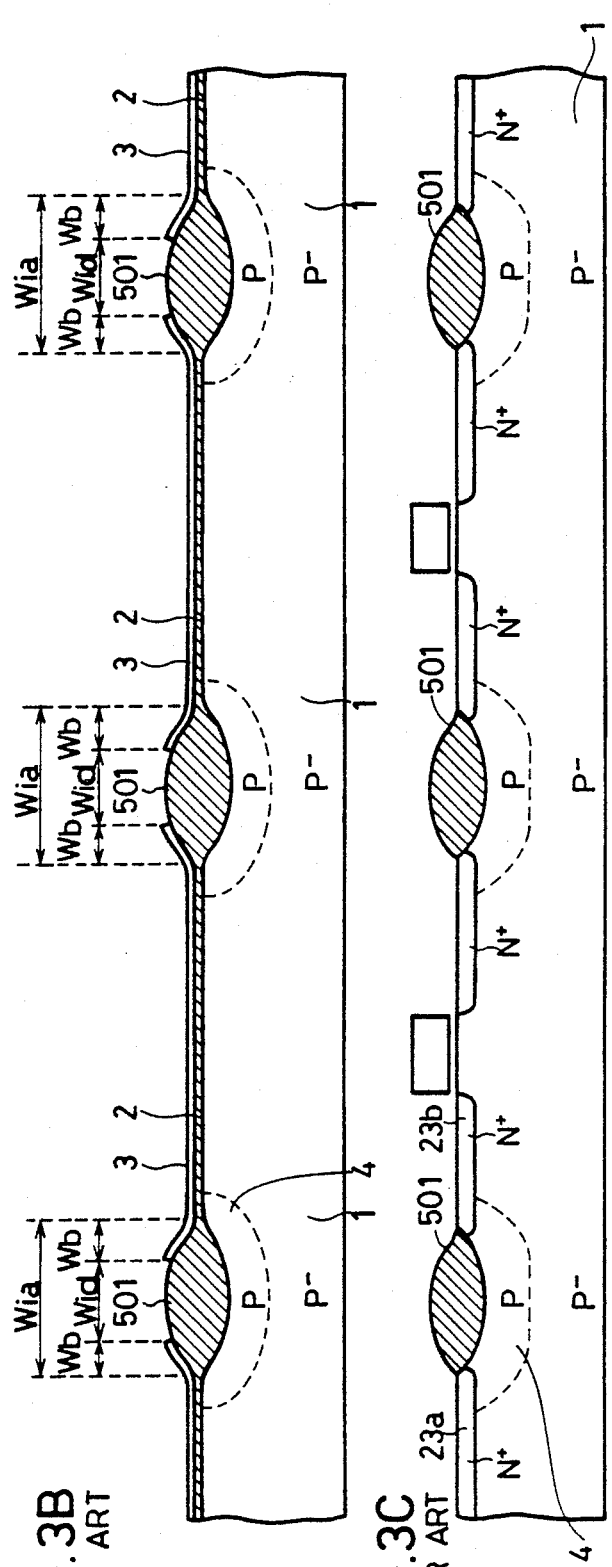
FIG. 3A PRIOR ART
FIG. 3B PRIOR ART
FIG. 3C PRIOR ART

PERIPHERAL CIRCUIT ⟷ MEMORY ARRAY

PERIPHERAL CIRCUIT | MEMORY ARRAY

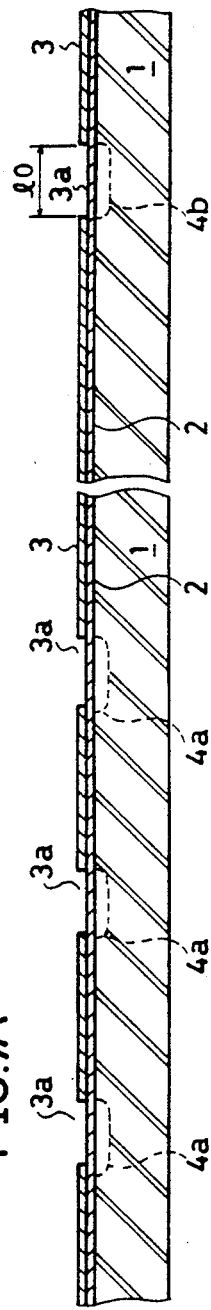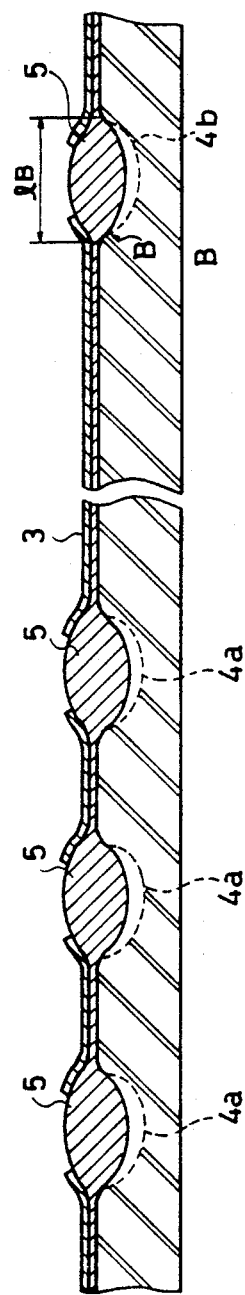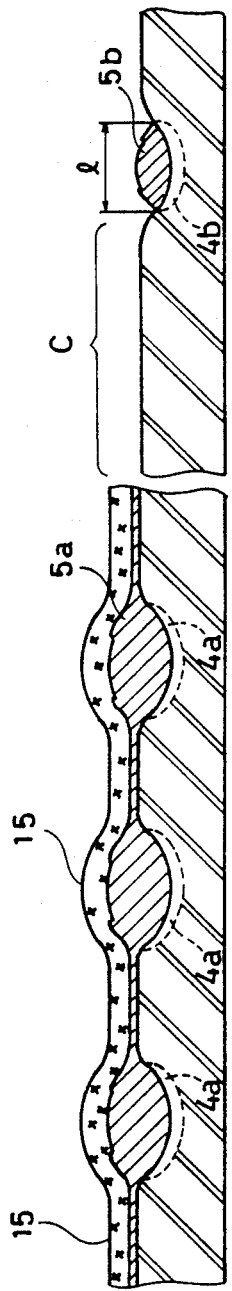

SEMICONDUCTOR INTEGRATED CIRCUIT HAVING OXIDE REGIONS WITH DIFFERNT THICKNESS

BACKGROUND OF THE INVENTION

1. Field of the Invention

The present invention relates generally to an integrated circuit and more particularly, to isolation between devices thereon.

2. Description of the Prior Art

FIG. 1 is a diagram showing a chip of a dynamic type semiconductor memory device as one example of a LSI.

Referring to FIG. 1, the chip comprises a memory array portion 21 and a peripheral circuit portion 22 such as sense amplifiers, decoders and the like.

FIG. 2 is a block diagram showing a whole structure of a dynamic type semiconductor memory device.

Referring to FIG. 2, the dynamic type semiconductor memory device comprises an array comprising a plurality of memory cells serving as a memory portion, a X decoder and a Y decoder for selecting each address thereof, and an input/output interface portion comprising a sense amplifier connected to an input/output buffer. A plurality of memory cells serving as a memory portion are each connected to intersection points of word lines connected to the X decoder and bit lines connected to the Y decoder, these word and bit lines constituting a matrix. The above-mentioned array is thus implemented.

Next, an operation is described. The memory cell at an intersection point of the word line and the bit line is selected, when each of these lines is selected by the X decoder and the Y decoder in response to a row address signal and a column address signal externally provided, and information is read or written from or to the memory cell through the input/output interface portion comprising the sense amplifier and the input/output buffer.

Although discussion herein directs to the dynamic random access memory, the principles to be described hereinafter is applicable to other IC's obtaining different types of circuit regions as well.

In isolating between devices of the LSI such as the conventional dynamic type semiconductor memory device, a so-called LOCOS (Local Oxidation of Silicon: J. A. Appels et al Philips Res Rept 25 118 (1970)) structure is used.

The LOCOS isolation method has been used extensively since 1970's as the device isolation technology for semiconductor integrated circuit devices. However, the following difficulties have been raised as devices have become fine and a dimension thereof has been decreased to approximately 1 μm.

FIG. 3A is a partial plan view showing a designed isolation region 500 and a designed active region Ri on a silicon substrate. FIGS. 3B and 3C are partial sectional views showing a device isolation technique by a selective oxidation method, taken along the line IIIB—IIIB in FIG. 3A.

(a) As shown in FIG. 3B, the field oxide film 501 makes encroachment under the silicon nitride film 3 (called bird's beaks) and a finished isolation width Wia is enlarged on both sides by Wb as compared with a designed isolation width Wid and, as a result, a portion of an active region that can be formed is reduced and it becomes difficult to form a fine device. Referring to FIG. 3A, the active region is reduced from a designed active region Ri to an actual active region Ra.

(b) As shown in FIG. 3C, because of a thermal treatment for the growth of the thick field oxide film 501, a p type impurity diffused region of the channel stopper region 4 is enlarged and a junction capacitance thereof with n type impurity diffused regions 23a and 23b is increased. In addition, in a MOS (Metal Oxide Semiconductor) transistor, a narrow channel effect in which a threshold voltage rises according to decrease of a channel width becomes noticeable.

(c) As shown in FIG. 3C, because the thick field oxide film 501 having a difference in level is formed in a region for isolation between devices, the surface of the isolation region becomes non-planar. This is inconvenient for formation of a fine pattern such as a wiring.

(d) Stress occurs between the thick field oxide film 501 and the silicon substrate 1 because of a thermal treatment for the growth of the thick field oxide film 501. This often brings about a crystalline defect such as stacking fault and the like in the silicon substrate 1.

In order to solve the above described difficulties, in place of the conventional LOCOS isolation method, a trench isolation technique is proposed which is described in "Deep Trench Isolated CMOS Devices" by R. D. Rung et al., International Electron Devices Meeting, 1982, Technical Digest, pp. 237. FIG. 3D is a partial plan view showing a designed isolation region 500 and an active region R on a silicon substrate. FIG. 3E is a partial sectional view showing a trench isolation structure, taken along the line IIIE—IIIE in FIG. 3D.

First, referring to the figures, in the trench isolation method, a trench is formed in a portion of the silicon substrate 1 serving as the isolation region by applying anisotropic etching such as reactive ion etching, using a pattern of a thick oxide film formed on the silicon substrate 1 as a mask. Boron (B+) is implanted in the trench, using the pattern on the thick oxide film as a mask and a channel stopper region 4 with high impurity concentration is formed in a portion of the silicon substrate 1 serving as the trench. A thin silicon oxide film is formed by applying thermal oxidation to the whole surface of the silicon substrate 1. An insulating material 502 such as silicon oxide is deposited over the whole surface such that the insulating material may fully fill in the trench, using the chemical vapor deposition method and the like. Then, a photoresist is provided over the whole surface. Dry etching is made with the condition enabling an etching rate of the photoresist and that of the insulating material 502 to be equal, until the surface of the insulating material 502 is on the same level with the surface of the silicon substrate 1. As a result, the insulating material 502 is embedded inside the trench and a region for isolation between devices is formed with trench structure. Then, after a gate electrode 9 is formed through a gate oxide film on a portion serving as, for example, the channel region of the MOS transistor, n type impurity diffused regions 23a and 23b serving as the source region and the drain region, respectively, of the MOS transistor are formed.

However, in the trench isolation, it is difficult to introduce an impurity to a vertical sidewall of the trench by an ion implantation method widely used in general. As a result, a leakage current is liable to flow along the sidewall of the trench. In addition, because of the concentration of an electric field around the corner portion of the trench, an effect of a parasitic MOS transistor is easily generated and therefore, the leakage current is also liable to flow. In case that the concentration of an electric field occurs in the corner portions of the edge of the channel region, a threshold voltage is also liable to be decreased. Furthermore, stress occurs due to a difference between a coefficient of thermal expansion of the insulating material 502 filled in the trench and that of the silicon substrate 1. This often brings about a crystalline defect in the silicon substrate 1. Still another disadvantage is that the process of forming the trench isolation comprises complex steps as described above.

Because of the above described disadvantages, the trench isolation method needs many technological improvements and at the present, it is not widely used in manufacturing semiconductor integrated circuit devices.

Another means for solving problems of the bird's beak is proposed in U.S. Pat. No. 4,574,465, entitled "Differing Field Oxide Thickness in Dynamic Memory Device", filed Apr. 13, 1982. FIGS. 4A to 4E are diagrams showing a manufacturing method of the memory array portion and the peripheral circuit portion in the dynamic memory device shown therein. A silicon oxide film 2 is formed on both the memory array portion and the peripheral circuit portion on a main surface of a semiconductor substrate 1, a silicon nitride film 3 is formed on a predetermined position thereon and by using this as a mask, inversion preventing layers 4a and 4b are formed and film 5 for isolation between devices adjacent 4a and 4b are formed to be thinner than the oxide film in thickness of the conventional peripheral circuit portion. Then, a silicon nitride film 24 is formed on the whole memory array portion, and only the peripheral circuit portion is oxidized, whereby the thickness of the film for isolation between devices of the peripheral circuit portion is formed to have a conventional thickness. As described above, the length of the bird's beak of the memory array portion is decreased by making the oxide film for isolation between devices of the memory array portion of the dynamic type memory device thinner than the film for isolation between devices of the peripheral circuit portion.

There is no problem even if the thickness of the oxide film for isolation between devices made thinner in the memory array portion because an applied voltage at the memory array portion is lower than the applied voltage at the peripheral circuit portion. As a result, the thickness of the oxide film for isolation between devices of the memory array portion can be formed to be thinner than the thickness of the oxide film for isolation between devices of the peripheral circuit portion as described above.

A semiconductor memory device using the conventional trench isolation method has a problem that process becomes complicated because a trench is filled to be flattened. Furthermore, as the trench is formed on the silicon substrate, distortion is generated in the silicon substrate and leakage is likely to occur on an upper portion of the trench corner portion, which was also a problem.

In a method of changing the thickness of the conventional field oxide film, even if the thickness of the oxide film for isolation between devices was made thinner, the bird's beak would occur anyway, and because the inversion preventing layer is formed at both memory array portion and peripheral circuit portion simultaneously, the concentration of the inversion preventing layer can not be changed at the memory array portion and the peripheral circuit portion, with the result that the thickness of the oxide film for isolation between devices formed thereon can not be set arbitrarily.

SUMMARY OF THE INVENTION

It is an object of the present invention to provide improved isolation between devices on the integrated circuit and a manufacturing method of a semiconductor device in which the thickness of an oxide film for isolation between devices can be set arbitrarily.

Another object of the present invention is to provide isolation between devices on the semiconductor integrated circuit wherein isolation oxide of different regions are different in thickness.

Still another object of the present invention is to provide isolation between devices on the semiconductor integrated circuit wherein different isolation oxide regions of the integrated circuit have a different impurity in concentration.

Further object of the present invention is to provide a method of manufacturing isolation oxides in semiconductor integrated circuits containing of memory region and peripheral region characteristic of the isolation oxide provided with different impurity concentration within the memory and peripheral regions.

The above-mentioned aim of the present invention can be attained by separately forming the oxide film for isolation between devices of the memory array portion and that of the peripheral portion, respectively, or by removing the bird's beak generated at the memory portion after the oxide film for isolation between devices is formed throughout.

Briefly stated, a manufacturing method of a semiconductor memory device in accordance with the present invention comprises the steps of forming the region for isolation between devices of the peripheral circuit portion, and thereafter forming the region for isolation between devices of the memory array portion.

Alternatively, forming the region for isolation between devices of the peripheral circuit portion and that of the memory array portion simultaneously and thereafter removing the bird's beak generated at the region for isolation between devices of the memory array portion.

Since the manufacturing method of a semiconductor device in accordance with the present invention comprises the above-mentioned steps, the thickness of the oxide film for isolation between devices of the memory array portion can be set arbitrarily, and also a semiconductor memory device and the manufacturing method thereof in which the capacitor area and the channel region of the memory array portion are enlarged can be provided without lowering the capability for isolation between devices of the peripheral circuit portion of the semiconductor memory.

In a preferred embodiment, a method of manufacturing a semiconductor device comprises the steps of forming the inversion preventing layer on the peripheral circuit portion, forming the oxide film for isolation between devices adjacent thereto, forming the inversion preventing layer having the impurity concentration higher than that of the peripheral circuit portion on the memory array portion and forming the oxide film for isolation between devices adjacent thereto at the same time that the oxide film is formed again on the peripheral circuit portion.

In a still preferred embodiment, a method of manufacturing a semiconductor device comprises the steps of forming the oxide film for isolation between devices on the semiconductor substrate and removing the top surface portion of the memory array portion by etching.

Since the method of manufacturing a semiconductor device comprises the above-described steps, the memory array portion will not be affected by the bird's beak generated at the time of forming the oxide film for isolation between devices because bird's beak is etched away.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram showing a chip of a dynamic type semiconductor memory device;

FIG. 2 is a block diagram showing the whole structure of a dynamic type semiconductor memory device;

FIG. 3A to FIG. 3E are views of a semiconductor memory device showing conventional locos and trench isolation methods;

FIGS. 7A to 7F are sectional views showing another embodiment of a manufacturing method of a semiconductor device in accordance with the present invention;

DESCRIPTION OF THE PREFERRED EMBODIMENTS

Figure 3D:
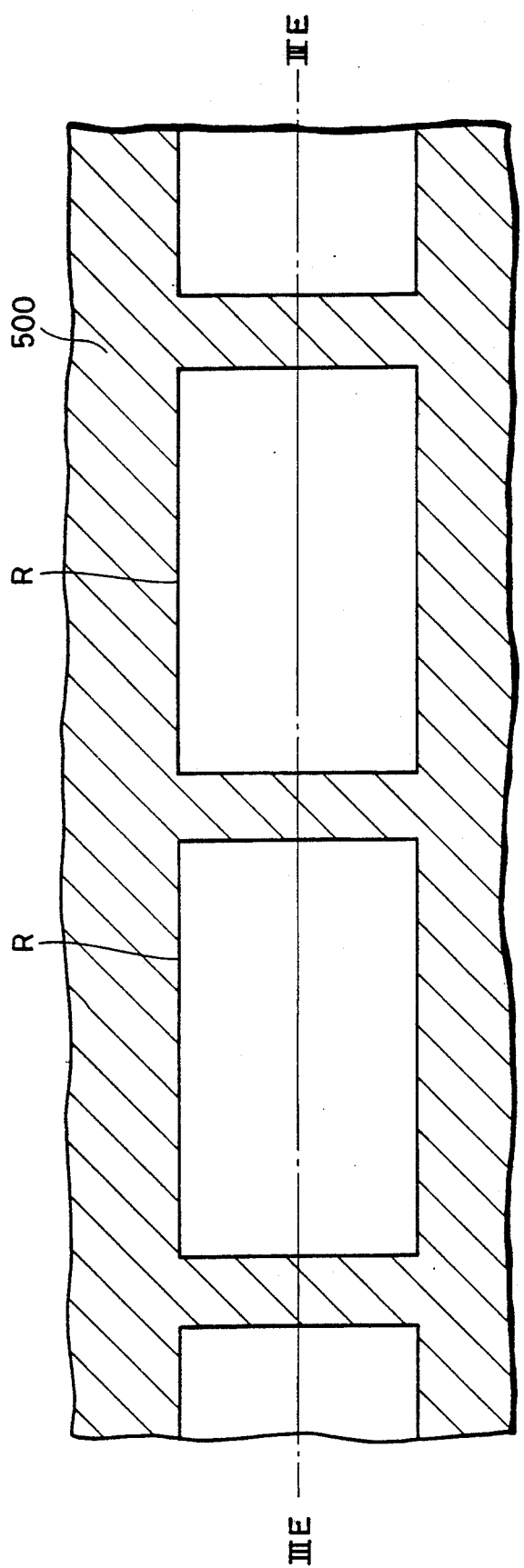
Figure 3E:
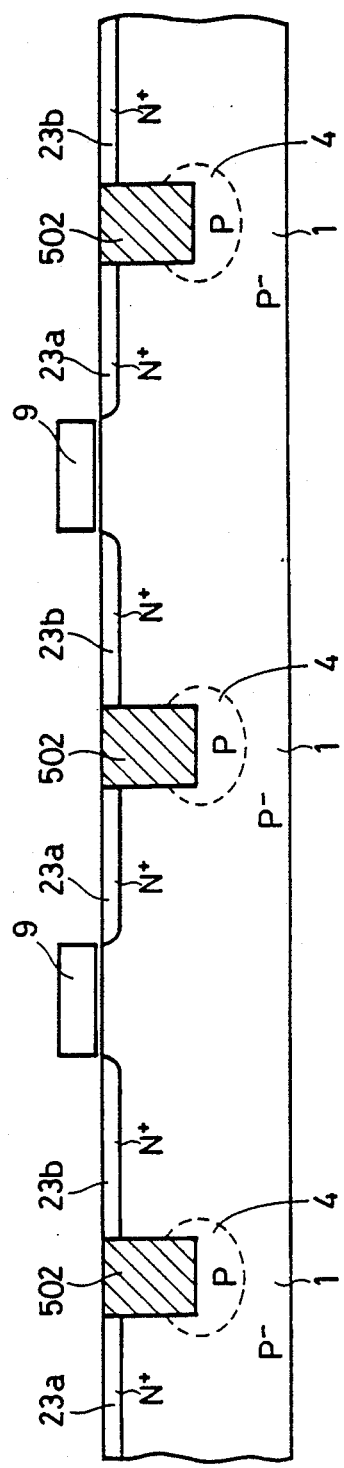
Figure 4A:
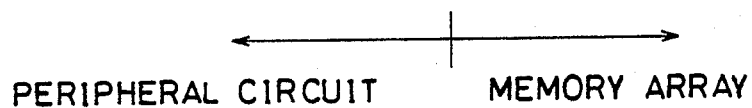
FIGS. 4A to 4E are diagrams showing another conventional means for solving problems of bird's beak.
Figure 4B:
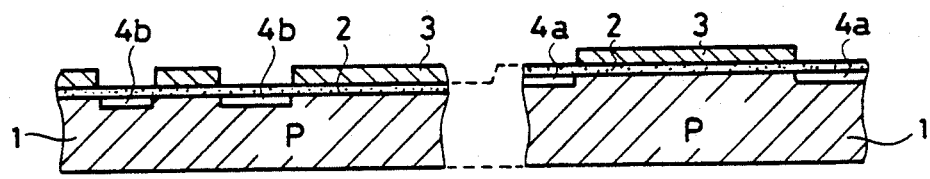
Figure 4C:
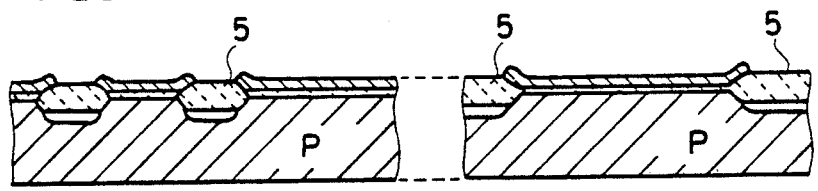
Figure 4D:
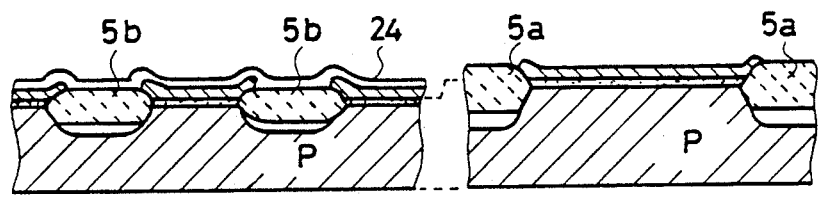
Figure 4E:
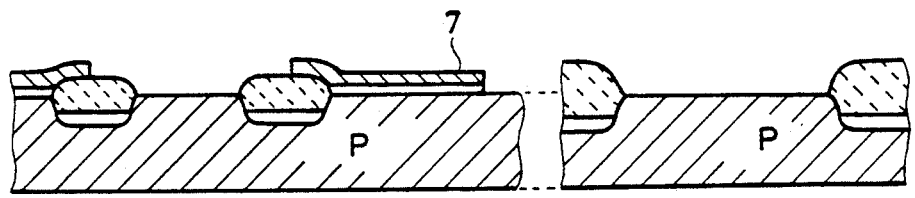
Figure 5A:
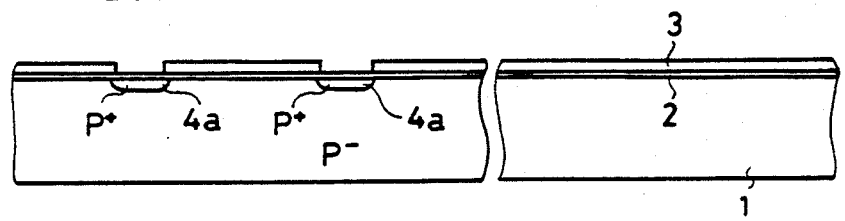
FIGS. 5A to 5E are sectional views showing a manufacturing method of a semiconductor memory device in accordance with one embodiment of the present invention.
Figure 5B:
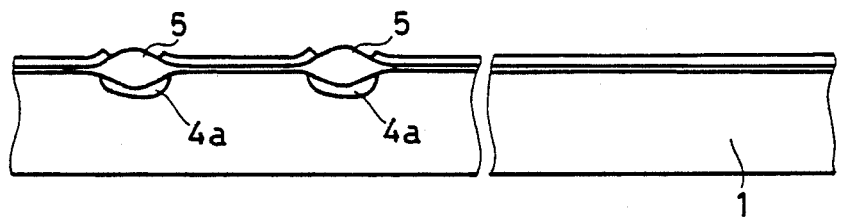
Figure 5C:
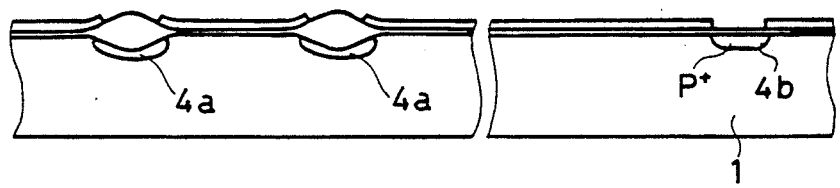
Figure 5D:
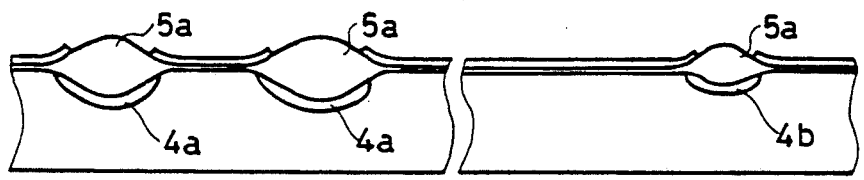
Figure 5E:
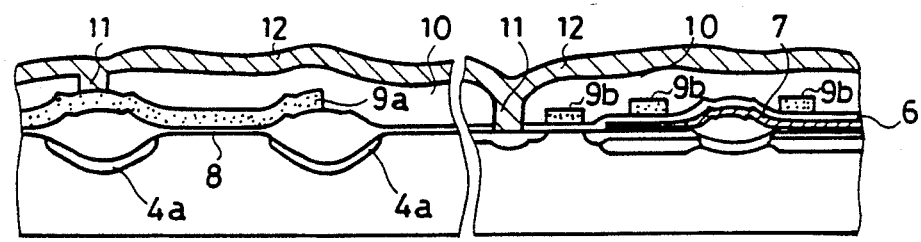
Figure 6:
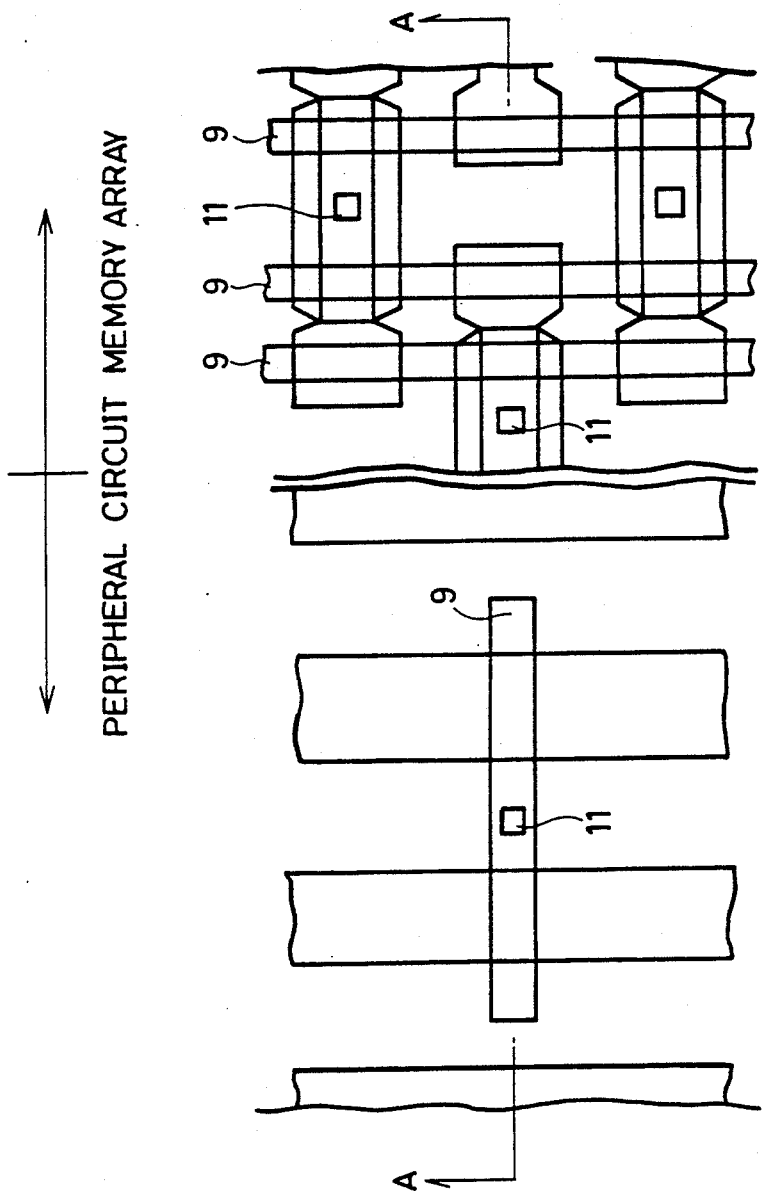
FIG. 6 is a plan view of the portion shown in FIG. 5E of the semiconductor memory device in accordance with the present invention.

Referring to the drawings, one embodiment of the present invention is described. FIGS. 5A to 5E are diagrams showing step by step a manufacturing method of a semiconductor memory device in accordance with the present invention, and FIG. 6 is a plan view of a semiconductor memory device showing one embodiment of the present invention, and the sectional view of the portion taken along the line A—A in FIG. 6 corresponds to FIG. 5E. As shown in FIG. 5A, a silicon oxide film 2 and a silicon nitride film 3 are formed successively on a p-type silicon substrate 1, then only the silicon nitride film 3 on the peripheral circuit portion is selectively etched, and boron for preventing inversion is implanted, with the result that a p+ diffused layer 4a is formed. The oxide film 5 for isolation between devices is formed only on the peripheral circuit portion using the silicon nitride film 3 as an oxidation-resistant mask (FIG. 5B). Then, as shown in FIG. 5C, only silicon nitride film 3 of the memory array portion is selectively etched and boron for preventing inversion is implanted, with the result that a p+ diffused layer 4b is formed. Since the inversion preventing layer and the oxide film for isolation between devices are separately formed in the peripheral circuit portion and the memory array portion, respectively, the concentrations of the p+ diffused layer 4a for preventing inversion of the peripheral circuit portion and the p+ diffused layer 4b for preventing inversion of the memory array portion can be determined arbitrarily and it becomes possible to raise the concentration of the p+ diffused layer 4b of the memory array portion and then to raise the capability for isolation between devices. Then, oxide films 5a and 5b for isolation between devices are formed again using the silicon nitride film 3 as the oxidation-resistant mask (FIG. 5D). At this time, since the oxide film 5b for isolation between devices of the memory array portion is formed by one step of oxidation, its bird's beak is shorter than that of the oxide film 5a for isolation between devices of the peripheral circuit portion formed by two steps of oxidation. More specifically, an active region is enlarged. Then, a gate insulating film 6 and a gate electrode 7 of the capacitor portion are selectively formed. After a gate electrode 9b of the transistor of the memory array portion and a gate oxide film 8 and a gate electrode 9a of the transistor of the peripheral circuit portion are formed, an interlayer oxide film 10, a contact hole 11 and an aluminum wire 12 serving as a bit line are formed (FIG. 5E). The process of formation of the device from FIGS. 5D to 5E is described in detail in another embodiment. Although a description was made as to the case in which the p-type silicon substrate is used, it is obvious that the same effect can be brought about in the case in which an n-type silicon substrate is used.

Next, another embodiment is described. FIG. 7 is an sectional view showing another embodiment of a manufacturing method of a semiconductor device in accordance with the present invention. In this embodiment, a memory array portion of a dynamic RAM and its peripheral circuit portion are formed on a p-type silicon semiconductor substrate 1.

In this method, the silicon oxide film 2 is formed on the semiconductor substrate 1 by thermal oxidation and the like and the silicon nitride film 3 is formed thereon by a CVD method. Then, a portion of the silicon nitride film 3 is selectively etched and boron is implanted from an etched opening 3a. As a result, the p+ diffused layer 4b for preventing the inversion is formed on the semiconductor substrate 1 under the opening 3a (FIG. 7A).

An oxide film is formed by the LOCOS method on the opening 3a using the silicon nitride film 3 as the oxidation-resistant mask (FIG. 7B). This oxide film becomes the oxide film for isolation between devices. The process heretofore is the same as the common LOCOS method. A bird's beak B is extended in the formed oxide film 5 for isolation between devices. An isolation length $l_B$ between devices is longer than a patterning length $l_O$ of the silicon nitride film 3 formed by the process shown in FIG. 7A.

After the silicon nitride film 3 on the top layer is removed entirely by etching, a resist 15 is applied. The resist 15 existing on the upper surface of the peripheral circuit portion only is left by patterning (the left portion of FIG. 7C). The silicon oxide film 2 on the whole surface of the memory array portion and the upper surface portion of the oxide film 5 for isolation between devices are uniformly removed by etching. Then a thin film for isolation between devices shown as 5b in FIG. 7C is formed. Therefore, the film thickness of the oxide film 5b for isolation between devices of the memory array portion is thinner than the film thickness of the insulating film 5a for isolation between devices remaining on the peripheral circuit portion. An tip portion of the bird's beak B is removed as the surface of the memory array portion is uniformly etched. As a result, the isolation length $l_B$ between devices of the insulating film 5 for isolation between devices of the initial stage (FIG. 7B) is shortened to the isolation length l between devices of the insulating film 5b for isolation between devices after etching. An active region C on the memory array portion is enlarged.

Figure 7D:
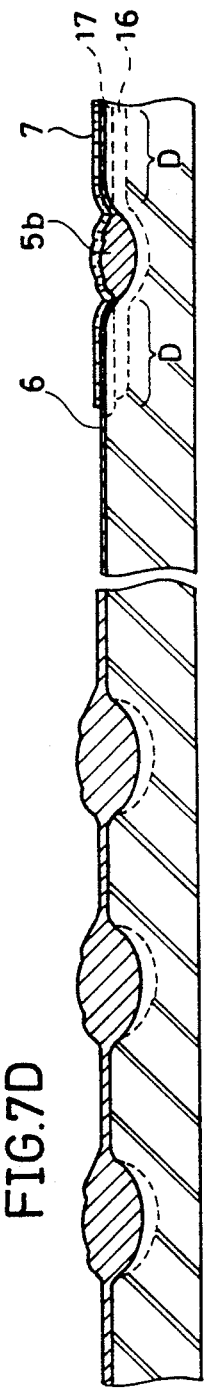

Then, the resist 15 of the peripheral circuit portion is removed. In the memory array portion, a so-called Hi-C structure is formed on a capacitor portion D of the memory cell. For this purpose, boron and arsenic are selectively implanted on the region comprising the insulating film 5b for isolation between devices. Then, as shown in FIG. 7D, a $p^+$ diffused layer 16 and an $n^+$ diffused layer 17 are formed, respectively. The $p^+$ diffused layer 16 is integrated with the $p^+$ diffused layer 4b having been formed on the memory array portion in FIG. 7C. At this time, if the energy of boron implantation is set to be high, boron which is implanted from the upper surface of the oxide film 5b for isolation between devices which has been thinned after etching by the process in FIG. 7C is easily penetrate the oxide film 5b for isolation between devices and reaches the $p^+$ diffused layer 4b. Thus, the impurity concentration of the $p^+$ diffused layer 4b for preventing the inversion under the insulating film 5b for isolation between devices becomes higher than the original concentration. As a result, the capability for isolation between devices of the insulating film 5b for isolation between devices which has been thinned is raised.

The gate insulating film 6 is formed further on the memory array portion. The capacitor portion D is formed on at least one portion above the region comprising the insulating film 5b for isolation between devices and its vicinity. The capacitor portion D comprises the capacitor electrode 7.

Figure 7E:
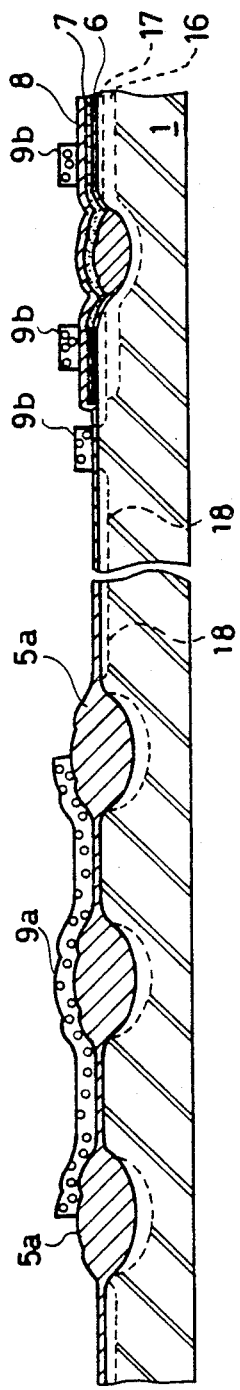

As shown in FIG. 7E, the gate oxide film 8 is formed over the memory array portion and the peripheral circuit portion. Then, the gate electrode 9b of the memory array portion and the gate electrode 9a of the peripheral circuit portion are formed. An $n^+$ diffused layer 18 for a source and drain is formed by an ion implantation.

Figure 7F:
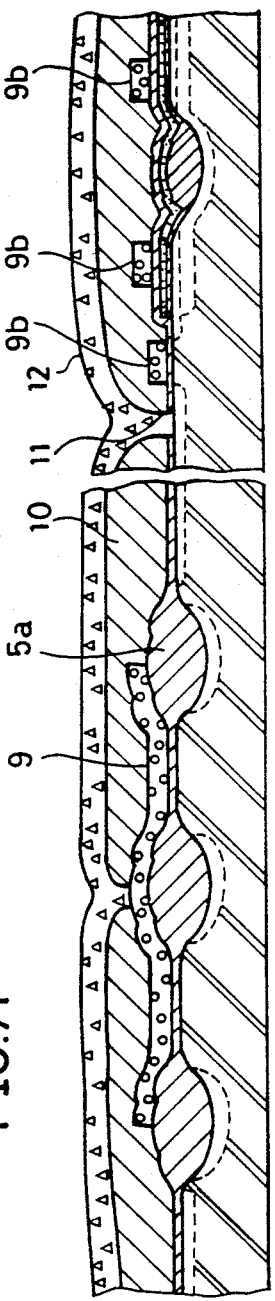

Next, an interlayer oxide film 10 is formed over the whole portion of the memory array portion and the peripheral circuit portion as shown in FIG. 7F. Etching is selectively performed on this film and a contact hole 11 is opened at a predetermined position. An aluminum wire 12 is then formed.

A plan structure view of a semiconductor device provided by such process is the same as that in FIG. 6.

Figure 8:
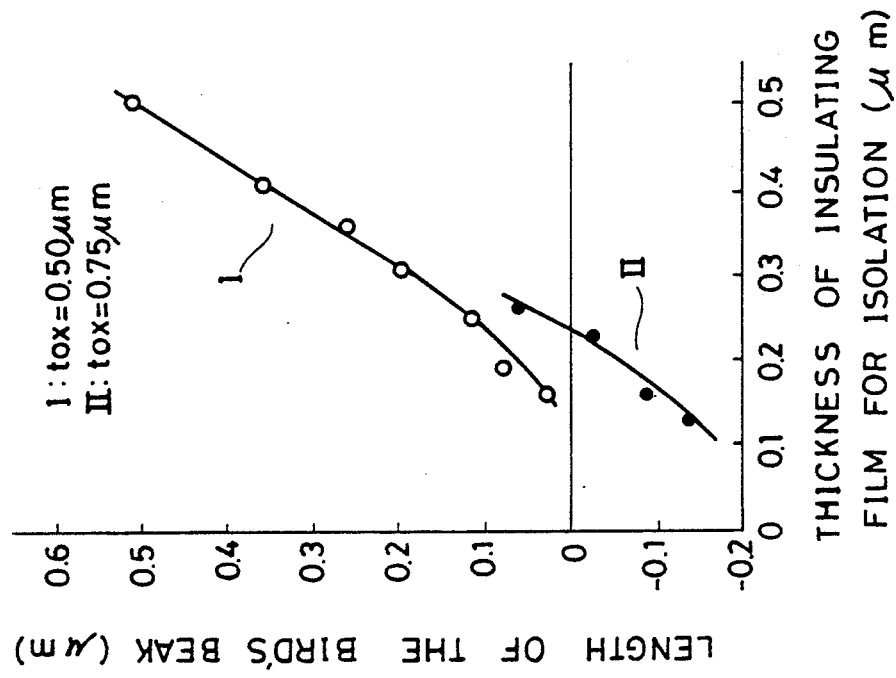
FIG. 8 is a graph showing a relation between the length of the bird's beak and the thickness of the insulating film for isolation between devices in the semiconductor memory device.

FIG. 8 is a graph showing the measurement in accordance with the experiment of a relation between the bird's beak length and the film thickness of the insulating film 5b for isolation between devices formed on the memory array portion by the above-mentioned process. The bird's beak length is defined as (lB−lO)/2 herein. Referring to FIG. 8, I and II denote that the film thickness $t_{OX}$ of the oxide film 5b for isolation between devices of the initial stage before etching is 0.50 μm and 0.75 μm, respectively. As seen from FIG. 8, even if the thickness of the oxide films for isolation between devices left by etching is the same, the bird's beak, the original film thickness $t_{OX}$ of which is thicker becomes shorter. If the original film thickness $t_{OX}$ is 0.75 μm (II), the bird's beak length can be made approximately 0 where the film thickness after etching is 0.24 μm.

Figure 9:
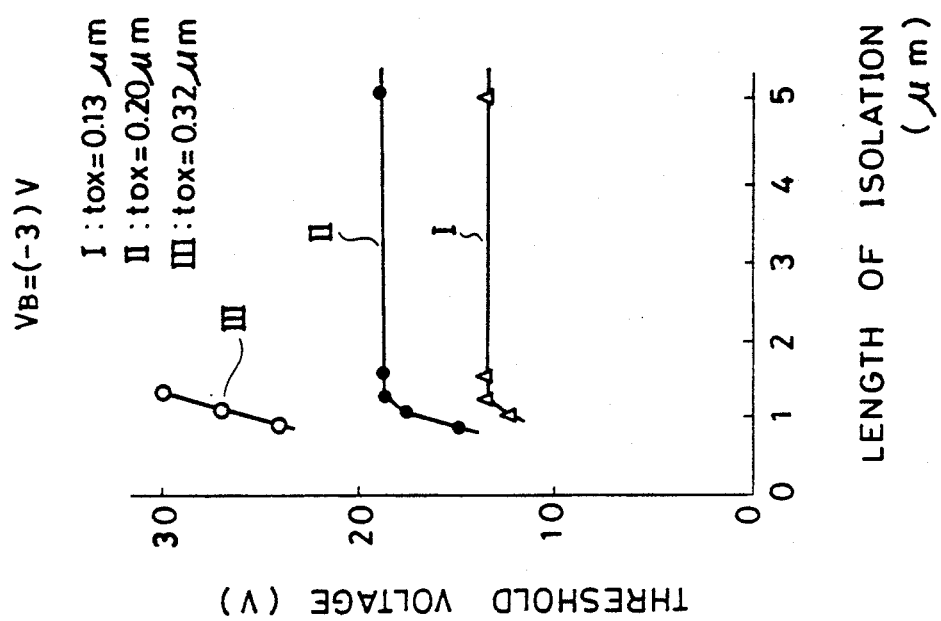
FIGS. 9 and 10 are graphs showing a relation between a threshold voltage of a parasitic transistor and the length of isolation of the region for isolation between devices when a back gate bias is (−3) V and 0 V, respectively.
Figure 10:
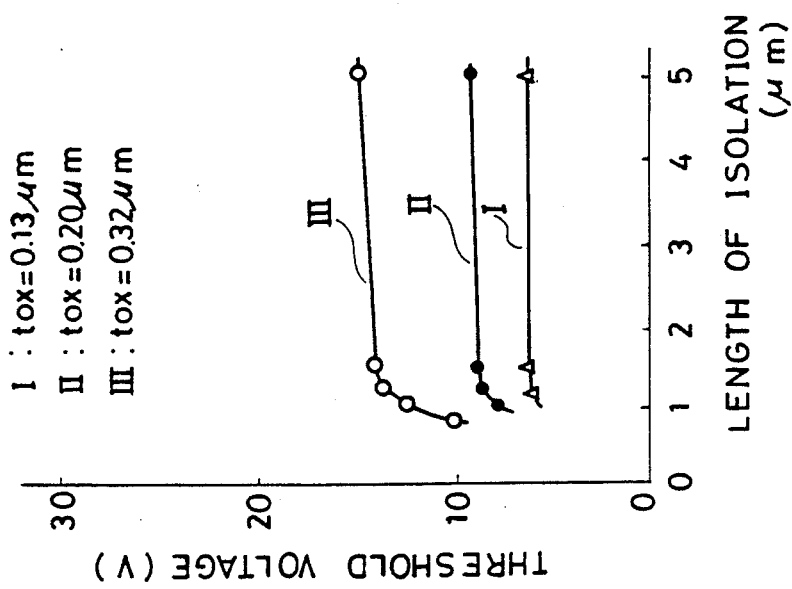

Referring to FIG. 8, the thinner the film thickness is made by etching, the less the bird's beak becomes. On the other hand, if the film thickness becomes too thin, the capability for isolation between devices could be degraded. In view of these facts, it is necessary to set a lower limit of the film thickness. FIGS. 9 and 10 are graphs showing a relation between the threshold voltage and the isolation length of the transistor for isolation between devices (the parasitic transistor generated in the vicinity of the insulating film for isolation between devices) as regards to each film thickness, where a back gate bias $V_B$ is $(-3)V$ and 0 V, respectively. Referring to FIG. 8, I, II and III denote the cases that the film thickness $t_{OX}$ is 0.13 μm, 0.20 μm and 0.32 μm, respectively. As seen from FIG. 9, when the back gate bias $V_B$ is $(-3)V$, the threshold voltage of either film thickness becomes 12 V or more. As a result, enough isolation capability can be secured. On the other hand, if the back gate bias $V_B$ is 0 V, the threshold voltage is about 6 V when the thickness of the insulating film for isolation between devices is 0.13 μm (which is the case of I in the figure), as shown in FIG. 10. For the dynamic type memory applied in this embodiment, the gate electrode 9a to which a voltage of power supply voltage (5 V) or more is applied is connected onto the insulating film 5a for isolation between devices in the peripheral circuit portion in FIG. 7F. On the other hand, a capacitor electrode 7 (so-called cell plate) to which only small voltage of 0 V to a half of the power supply voltage (2.5 V) is applied is connected onto the insulating film 5b for isolation between devices of the memory array portion. For these reasons, an isolation-resistant voltage on the memory array portion of 5 V or more is enough.

Therefore, in the memory array portion in which it is necessary to provide large channel width and capacitor area as shown in the embodiment, the isolation length between devices is shortened by employing the oxide film 5b for isolation between devices, the etched film thickness of which is thin. In the peripheral circuit portion in which a high voltage is applied, the sufficient channel width is provided and there is no problem such as the narrow channel effect, the oxide film 5a for isolation between devices is employed which has not been etched yet after formed by the LOCOS method. Therefore, the capability for isolation between devices adapted to that section can be applied to both the peripheral circuit portion and the memory array portion.

Figure 11:
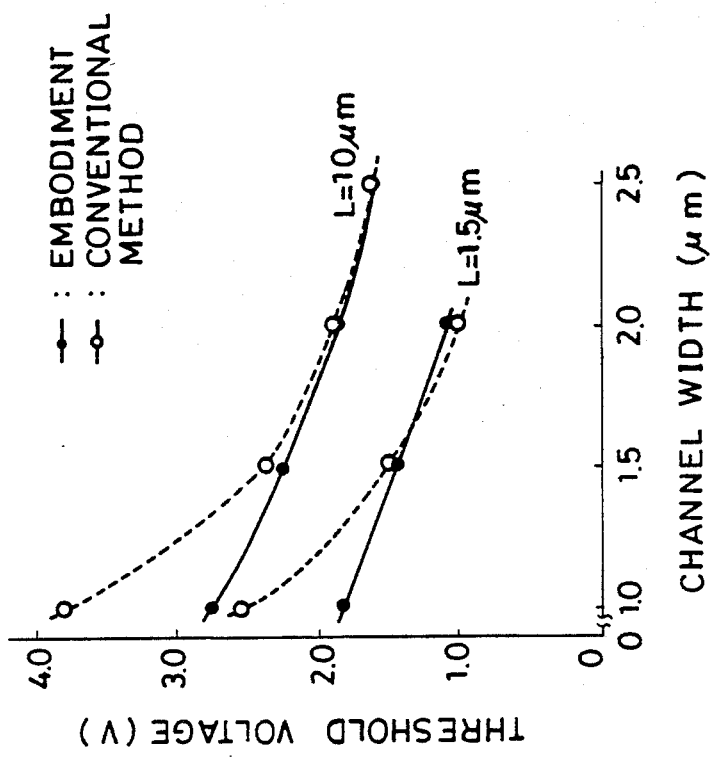
FIG. 11 is a graph showing a comparison between the narrow channel effect of the isolation between devices in accordance with another embodiment and that of the isolation between devices in accordance with the conventional manufacturing method.

FIG. 11 is a graph showing the difference between the narrow channel effect of the transistor of the memory cell in which a manufacturing method of this embodiment is employed and that of the memory cell in which the conventional manufacturing method is employed. A solid line denotes the memory cell in which this embodiment is employed and a dotted line denotes the case in which the conventional memory cell is employed. The comparison is shown between the channel length L=10 μm and L=1.5 μm. The channel width of the abscissa is the channel width which is set on a mask used for forming the silicon nitride film 3 in FIG. 7A. As shown from this figure, in the embodiment, even if the channel width set on the mask is small, the threshold voltage of the transistor comprised in the memory cell is not increased so much. It is seen that the narrow channel effect is considerably restrained by the isolation between devices in accordance with the present invention. This is because the bird's beak can be made small in the embodiment, while the channel width substantially became narrow by the effect of the above-mentioned bird's beak in the conventional isolation between devices Although the case in which the p-type silicon substrate is used as the semiconductor substrate 1 is shown in the above-mentioned embodiment, an n-type silicon substrate is similarly applicable to the semiconductor substrate. The present invention is also applicable to the isolation between devices of a complementary transistor. The present invention is also applicable not only to the dynamic type memory but also to a semiconductor device in general in which it is required to secure an enough active region. The bird's beak is typically generated in the LOCOS method. Therefore, the present invention is applicable when another method of forming the insulating film for isolation between devices is used, in which the insulating film becomes longer than a desired length.

As mentioned above, in accordance with the present invention, the oxide film for isolation between devices and the inversion preventing layer of the memory array portion and the peripheral circuit portion of the semiconductor memory device are formed separately, or after they are formed simultaneously, the oxide film generated by the bird's beak is removed by etching on the memory array portion. As a result, the thickness of the oxide film for isolation between devices of the memory array portion becomes thinner than that of the peripheral circuit portion, the region of the semiconductor device of the memory array portion is enlarged and the capacitor area and the channel region of the memory array portion becomes larger than the conventional one. Therefore, meritorious effects can be brought about that the amount of a storage electric charge becomes larger and a soft error does not easily occur. There is another effect that the reliability is increased because the same thickness as in the conventional device of the oxide film for isolation between devices is secured in the peripheral circuit portion, whereby the capability for isolation between devices is not lowered in the peripheral circuit portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device having a plurality of active element devices on a main surface of a semiconductor substrate of a predetermined impurity concentration of a selected conductivity type and having a first function region, the operating voltage of which is relatively high and a second function region, the operating voltage of which is relatively low, comprising the steps of:
    forming an oxide layer on said first and said second function regions;
    forming a mask layer for forming the region for isolation between active element devices for isolating devices;
    removing said mask layer of the region for isolation between devices on said first function region, and forming a first inversion preventing layer having a first selected impurity concentration on said region in which the mask layer is removed and on said main surface;
    forming a first oxide layer for isolation between active element devices adjacent an upper portion of said first inversion preventing layer;
    removing said mask layer of the region for isolation between active element devices on said second function region, and, on said region in which the mask layer on said second function region is removed and on said main surface, forming a second inversion preventing layer having a second selected impurity concentration different from said first selected impurity concentration of said first inversion preventing layer; and
    forming a second oxide layer for isolation between active element devices adjacent to an upper portion of said second inversion preventing layer by simultaneously oxidizing said first function region and said second function region,
    whereby the thickness of said first oxide layer for isolation between active element devices is formed to be greater than the thickness of said second oxide layer for isolation between active element devices.

2. A method of manufacturing a semiconductor memory device in accordance with claim 1, wherein said first function region comprises a peripheral circuit portion of a semiconductor memory device and said second function region comprises a memory array portion of a semiconductor memory device.

3. A method of manufacturing a semiconductor memory device in accordance with claim 2, wherein said mask layer is a silicon nitride layer.

4. A method of manufacturing a semiconductor memory device in accordance with claim 3, wherein said inversion preventing layer is of the same conductivity type as said semiconductor substrate and has the impurity concentration higher than the predetermined impurity concentration of said semiconductor substrate.

5. A method of manufacturing a semiconductor memory device in accordance with claim 4, wherein the second impurity concentration of said second inversion preventing layer is higher than the first impurity concentration of said first inversion preventing layer.

6. A method of manufacturing a semiconductor memory device in accordance with claim 1, wherein the second impurity concentration of said second inversion preventing layer is higher than the first impurity concentration of said first inversion preventing layer.

* * * * *